United States Patent
Furuya

(10) Patent No.: US 7,454,836 B2
(45) Date of Patent: Nov. 25, 2008

(54) METHOD FOR MANUFACTURING INKJET HEAD, AND INKJET HEAD

(75) Inventor: Noboru Furuya, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/684,773

(22) Filed: Mar. 12, 2007

(65) Prior Publication Data
US 2007/0214621 A1  Sep. 20, 2007

(30) Foreign Application Priority Data
Mar. 15, 2006  (JP) .............................. 2006-070906

(51) Int. Cl.
*B21D 53/76* (2006.01)
*B41J 2/14* (2006.01)
(52) U.S. Cl. ........................ 29/890.1; 29/25.35; 29/830; 29/831; 29/832; 29/846; 347/47
(58) Field of Classification Search ............... 29/25.35, 29/890.1, 832, 831, 830, 846, 847; 347/47, 347/45, 68–70, 72; 427/100; 216/27
See application file for complete search history.

(56) References Cited
U.S. PATENT DOCUMENTS
6,322,198 B1 * 11/2001 Higashino et al. .......... 347/54
6,419,848 B1 * 7/2002 Qiu et al. ................ 252/62.9 R
6,450,618 B2 * 9/2002 Kato et al. .................... 347/54
6,895,659 B2 * 5/2005 Moon et al. ................... 29/611

FOREIGN PATENT DOCUMENTS
JP      2004-006722        1/2004

* cited by examiner

*Primary Examiner*—David P. Bryant
*Assistant Examiner*—Tai Nguyen
(74) *Attorney, Agent, or Firm*—Harness, Dickey & Pierce, P.L.C.

(57) ABSTRACT

A method for manufacturing an inkjet head having a pressure chamber that stores ink, a nozzle that is provided at the pressure chamber and ejects the ink, and an actuator that changes an internal pressure of the pressure chamber to eject the ink in the pressure chamber through the nozzle. The method includes the steps of: forming the actuator on a substrate by using one of a liquid phase method and a vapor phase method to manufacture an upper structure; separating the upper structure from the substrate; forming a lower structure having the pressure chamber with metallic glass, independently of the substrate; and joining the upper structure and the lower structure.

12 Claims, 8 Drawing Sheets

METHOD FOR MANUFACTURING INKJET HEAD, AND INKJET HEAD

The entire disclosure of Japanese Patent Application No. 2006-070906, filed Mar. 15, 2006 is expressly incorporated by reference herein.

BACKGROUND

1. Technical Field

The present invention relates to an inkjet head that ejects ink and a method for manufacturing an inkjet head.

2. Related Art

As inkjet heads used for inkjet printers, piezoelectric type inkjet heads and bubble type (thermal type) inkjet heads are known. These inkjet heads are provided with a pressure chamber that stores ink, and structured to push out and eject ink, by an actuator in the case of the piezoelectric type inkjet head, and by a bubble that is generated by boiling a solvent in the case of the bubble type inkjet head.

Pressure chambers of the inkjet heads, for example, in the piezoelectric type and bubble type inkjet heads, are generally formed in a silicon substrate (silicon wafer) by a semiconductor process. Reasons for forming pressure chambers in a silicon substrate are because silicon substrates (silicon wafers) are relatively readily processed, and therefore pressure chambers can be accurately fabricated. Also, in the bubble type inkjet head in particular, heaters can be readily formed on a silicon substrate, and the silicon substrate has sufficient heat resistance to tolerate heating by the heaters.

It is important to lower the defect rate caused by foreign matters and defects and improve the yield in order to lower the manufacturing cost in a semiconductor process that uses such silicon substrates (silicon wafers) as described above. The yield is greatly influenced by the chip size. When a desired number of nozzles is to be secured in a chip for inkjet head (hereafter also referred to as a head chip), which is an element for forming the inkjet head, the head chip becomes relatively large, compared to an IC chip, and therefore it is essentially difficult to improve the yield.

For example, an inkjet head with the currently highest dot density is provided with 600 dpi (at a nozzle pitch of 42.3 µm), and the size of a single chip composing this inkjet head is substantially large, compared to an IC chip. Accordingly, the number of head chips that may be obtained from a single silicon substrate (silicon wafer) is fewer, compared to that of IC chips. Therefore, in order to secure a greater number of non-defective head chips, it is necessary to improve the yield to a level higher than that of IC chips.

As described above, for example, in a piezoelectric type inkjet head, pressure chambers alone are formed in a silicon wafer, and other components such as actuators having piezoelectric thin films composed of PZT or the like are laminated on the silicon wafer, thereby assembling the inkjet head. This manufacturing method has been in the mainstream of assembling inkjet heads. However, this manufacturing method has a problem in the accuracy in processing components other than pressure chambers, and therefore its ability in achieving higher integration is limited.

In this regard, a manufacturing method by MEMS (micro electro mechanical systems), in which actuators and wirings to be connected to the actuators are directly formed on a substrate, has been developed in recent years. According to this manufacturing method, actuators and wirings are formed on a substrate, and then the same substrate is processed to form pressure chambers. Further, the substrate is divided into individual pieces (diced) depending on the requirements, whereby head chips that are components of inkjet heads are manufactured (see, for example, Japanese laid-open patent application JP-A-2004-6722).

In such a manufacturing method, when forming a piezoelectric thin film (piezoelectric film) composed of PZT or the like by a vapor phase method or a liquid phase method, the annealing temperature for crystallization may reach, for example, about 600° C. Therefore, the substrate is required to have a heat resistance at least at 600° C. or higher. Accordingly, the use of silicon (a silicon wafer) as a substrate is very practical, because there is no problem in terms of heat resistance, and the aforementioned advantage in which pressure chambers can be readily and highly accurately formed can be maintained.

However, this manufacturing method requires additional steps of forming actuators and wirings to be connected to the actuators on a silicon substrate, compared to the method in related art in which pressure chambers alone are formed from a silicon substrate, such that the processing on the silicon substrate is prolonged, and defects that may be caused by foreign matters and deficiencies would likely occur. As a result, the number of non-defective head chips that can be obtained from a single silicon substrate (silicon wafer) is not very high, in other words, a sufficient yield cannot be achieved. Therefore, non-defective head chips cannot be secured sufficiently in absolute quantity, as described above, and a reduction in the manufacturing cost has substantially been prevented.

SUMMARY

In accordance with an advantage of some aspects of the invention, it is possible to provide an inkjet head and a method for manufacturing an inkjet head, whereby the yield in manufacturing non-defective head chips can be improved, their absolute quantity can be sufficiently secured, and thus the manufacturing cost can be lowered.

A method for manufacturing an inkjet head in accordance with an embodiment of the invention pertains to a method for manufacturing an inkjet head having a pressure chamber that stores ink, a nozzle that is provided at the pressure chamber and ejects the ink, and an actuator that changes an internal pressure of the pressure chamber to eject the ink in the pressure chamber through the nozzle, and the method includes the steps of: forming the actuator on a substrate by using a liquid phase method or a vapor phase method to manufacture an upper structure; separating the upper structure from the substrate; forming a lower structure having the pressure chamber with metallic glass, independently of the substrate; and joining the upper structure and the lower structure.

According to the method for manufacturing an inkjet head, the upper structure including the actuator and the lower structure having the pressure chamber are not formed from a single substrate, but are formed independently of one another, and then are joined together to form, for example, a head chip that is a component of an inkjet head. Therefore, by joining upper structures that have been examined in advance and determined to be non-defective and lower structures that have been independently examined and determined to be non-defective, the non-defective rate (yield) of head chips can be increased, and their absolute quantity can be sufficiently secured.

According to the method in related art in which actuators and wirings to be connected to the actuators are directly formed on a silicon substrate, and pressure chambers are also formed in the same silicon substrate, the pressure chambers are formed after the actuators and wirings have been formed through many processing steps. Therefore, if defects occur in the pressure chambers due to, for example, foreign matters and deficiencies, the actuators and wirings that are normal, but formed on these defective pressure chambers, would consequentially become parts of defective products. Accordingly, these normal actuators and wirings cannot be included in final products, such that the yield is substantially lowered, and a reduction in the cost is prevented.

In contrast, in accordance with the present embodiment, as described above, normal upper structures that are determined non-defective are joined with lower structures that are similarly determined non-defective, whereby the problem in which normal components are rejected as defective can be eliminated, and therefore the non-defective rate (yield) of head chips can be improved, their absolute quantity can be sufficiently secured, and thus the manufacturing cost can be lowered.

Also, in the present embodiment of the invention, the lower structure is formed from metallic glass. Therefore, process-induced differences are fewer, and the non-defective rate becomes higher, compared to the related art in which the lower structure is formed from a silicon wafer. Also, metallic glass is inexpensive compared to silicon that is generally expensive, such that the material cost can be lowered.

Also, the manufacturing process for forming the upper structure of the inkjet head which includes a high-temperature process, and the manufacturing process for forming the lower structure which includes a low-temperature process are not continuously conducted, but conducted independently of one another. Therefore the process management is easier, and thus the productivity can be improved.

In the method for manufacturing an inkjet head described above, the step of forming the lower structure may preferably include the steps of: forming a silicon mold for forming the lower structure by processing silicon; injecting metallic glass in the silicon mold; and separating the metallic glass from the silicon mold to thereby form the lower structure.

According to the above, by using the silicon substrate, the silicon mold can be relatively readily formed with high precision, and therefore the lower structure can be more readily and highly accurately formed from the silicon mold.

In the method for manufacturing an inkjet head described above, the step of forming the lower structure may preferably include the steps of: forming a replica of the lower structure by processing silicon; forming a conductive film on a surface of the replica; forming a metal mold that covers the surface of the replica by an electroforming method; separating the replica from the metal mold; injecting metallic glass in the metal mold; and separating the metallic glass from the metal mold to thereby form the lower structure.

Because the replica is fabricated from silicon, the replica can be highly accurately formed. Accordingly, the metal mold formed based on the replica becomes highly accurate, and therefore the lower structure can be highly accurately formed from the metal mold. Also, the metal mold is highly durable, compared to a mold formed from, for example, silicon, and therefore excels in mass-productiveness.

Also, in the method for manufacturing an inkjet head described above, the step of forming the lower structure may preferably include forming an oxide film on a surface layer section of the lower structure composed of the metallic glass by thermally oxidizing the surface layer section. As a result, a surface composing the inner wall surface of the pressure chamber is also formed form an oxide film and therefore becomes chemically stable, such that its chemical-resistance property improves, and exhibits favorable resistance to a variety of inks.

Also, in the method for manufacturing an inkjet head described above, the step of forming the lower structure may include forming a plurality of members with metallic glass that compose the lower structure, and then assembling the members to form the lower structure.

Even the lower structure has a complex configuration, the lower structure is formed from a plurality of members, and the members are assembled to obtain the lower structure. Therefore, each of the members can be formed in a relatively simple configuration, and fabrication of the lower structure of a complex configuration can be made relatively easy.

Also, in the method for manufacturing an inkjet head described above, the actuator may preferably be formed from a piezoelectric device.

By forming the actuator from a piezoelectric device, driving for ink ejection can be accurately performed, and driving at a higher speed compared to a bubble system becomes possible.

Also, in the method for manufacturing an inkjet head described above, the substrate may preferably be a silicon substrate.

A high temperature heat treatment process is necessary for forming piezoelectric elements on a substrate in particular, and therefore a sufficient heat resisting property is required as a substrate. By using a silicon substrate as the substrate, the requirement for heat resistance can be satisfied. Also, when actuators are formed by a semiconductor process, the use of a silicon substrate as the substrate is advantageous, because a wide range of choices in substrate sizes is available, a large-size substrate (e.g., a 12 inch wafer) can be used, and an existing semiconductor processing apparatus can be used as it is.

Moreover, in the method for manufacturing an inkjet head described above, the metallic glass may preferably include at least one of Pd, Cu, Si, Al, Zr, a rare earth, Ti, Fe, Mg, Ni, Co and Ca as a principal constituent or an additive constituent. Accordingly, by appropriately adjusting the metallic glass material, its bonding property with respect to the upper structure can be improved.

An inkjet head in accordance with an embodiment of the invention pertains to an inkjet head having a pressure chamber that stores ink, a nozzle that is provided at the pressure chamber and ejects the ink, and an actuator that changes an internal pressure of the pressure chamber to eject the ink in the pressure chamber through the nozzle, wherein the actuator is formed on a substrate by using a liquid phase method or a vapor phase method, and an upper structure obtained by separating from the substrate and a lower structure having the pressure chamber and formed from metallic glass independently of the substrate are joined together in one piece.

According to the inkjet head described above, the upper structure including the actuator and the lower structure having the pressure chamber are not formed from a common substrate, but are formed independently of one another, and then are joined together to form, for example, a head chip that is a component of an inkjet head. Therefore, by joining upper structures that have been examined in advance and determined to be non-defective and lower structures that have been independently examined and determined to be non-defective, the non-defective rate (yield) of head chips can be increased, and their absolute quantity can be sufficiently secured. Also, because the lower structure is formed from metallic glass, process-induced differences are fewer, and the non-defective rate becomes higher, compared to the related art in which the lower structure is formed from a silicon wafer. Also, metallic glass is inexpensive compared to silicon that is generally expensive, such that the material cost can be lowered.

DESCRIPTION OF EXEMPLARY EMBODIMENTS

Figure 1:
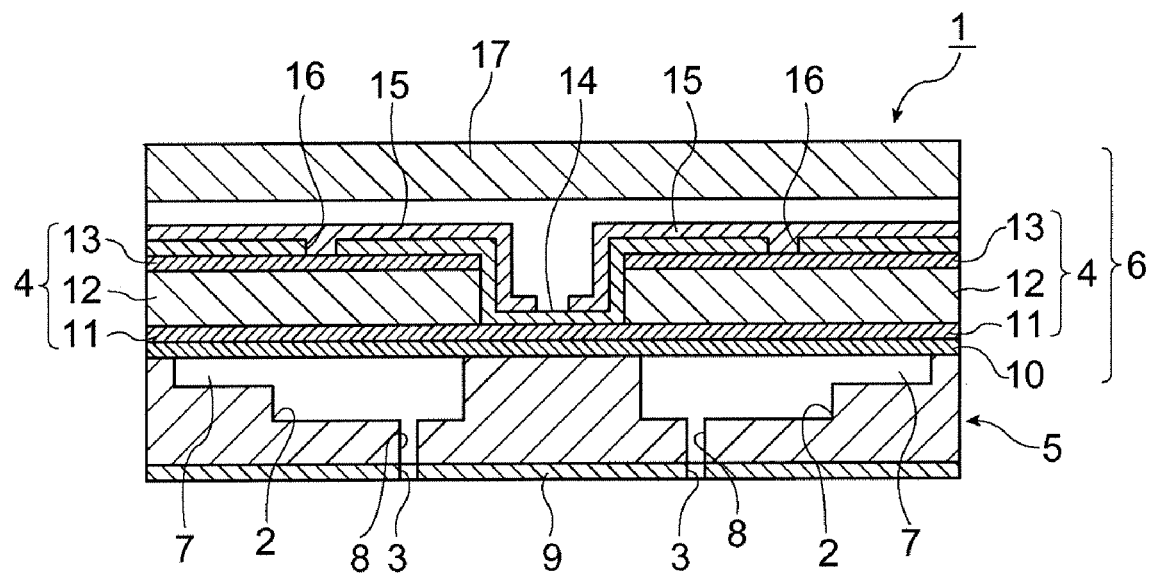
FIG. 1 is a cross-sectional side view of an inkjet head in accordance with an embodiment of the invention.

Preferred embodiments of the invention are described below. First, an inkjet head in accordance with an embodiment of the invention is described. FIG. 1 is a view of a major portion of an inkjet head in accordance with the embodiment, in other words, a view showing a major portion of a head chip. Reference numeral 1 in FIG. 1 denotes an inkjet head. The inkjet head 1 may be used for an inkjet printer, and is equipped with pressure chambers 2 that store ink, nozzles 3 that are provided at the pressure chambers 2 and eject the ink, and actuators 4 that change an internal pressure of the pressure chambers 2 to thereby eject the ink in the pressure chambers 2 through the nozzles 3.

Also, the inkjet head 1 is formed from a generally rectangular parallelepiped head chip or a plurality of head chips (not shown), each having a lower structure 5 forming a portion including the pressure chambers 2 and an upper structure 6 forming a portion including the actuators 4. The head chip is provided with multiple actuators 4 (for example, in a matrix of 180×2 rows, or 360×2 rows), and pressure chambers 2 formed in one-to-one correspondence with the actuators 4.

The lower structure 5 is in a generally rectangular parallelepiped shape, and is composed of a hardened body of metallic glass. As described above, the lower structure 5 has the multiple pressure chambers 2, a connection passage section 7 at a side of the pressure chambers 2, and nozzle sections 8 formed in a bottom surface side of the pressure chambers 2. The lower structure 5 is provided on its bottom surface side, in other words, on the bottom surface side of the inkjet head 1, with a nozzle plate 9 having nozzles 3 connecting to the nozzle sections 8 attached thereto. The metallic glass composing the lower structure 5 may preferably include at least one of Pd, Cu, Si, Al, Zr, a rare earth, Ti, Fe, Mg, Ni, Co and Ca as a principal constituent or an additive constituent. The metallic glass solidifies and becomes vitreous, when heated at a low temperature and then cooled, as described below. The metallic glass is placed in a forming mold before or after its solidification, a predetermined configuration of the mold is transferred to the metallic glass, and then the formed metallic glass is separated from the mold, whereby the lower structure is formed.

It is noted that the pressure chambers 2 are open at the upper surface side of the lower structure 5, and open only at the nozzle sections 8 on the bottom surface (lower surface) side, and are covered by a vibration plate 10 of the upper structure 6 at their upper surface side to be described below. Therefore each of the pressure chambers 2 is formed generally in a closed state except its nozzle aperture and ink supply port.

Figure 2:
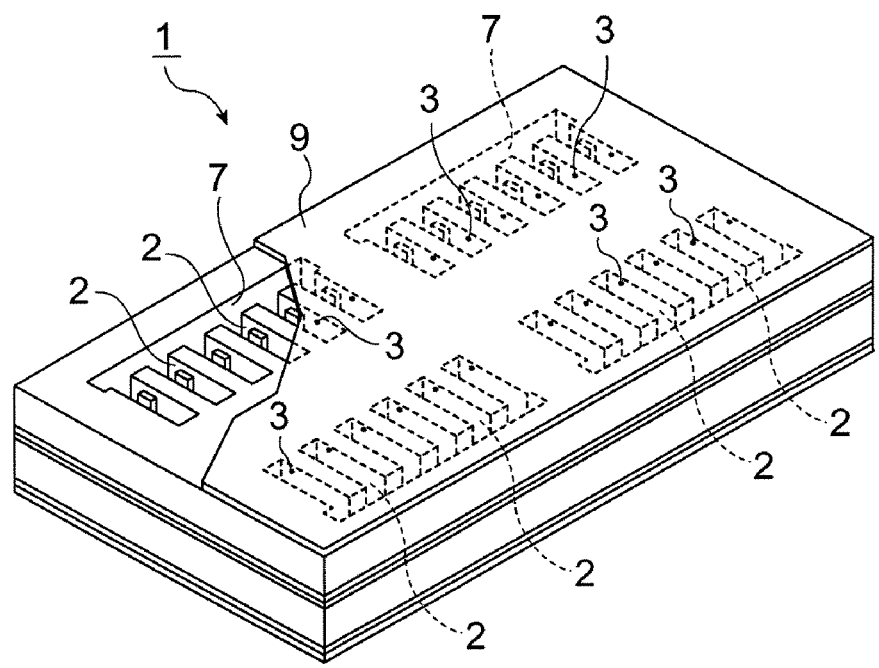
FIG. 2 is a perspective view showing a bottom side of the inkjet head shown in FIG. 1.

As shown in FIG. 2 that is a perspective view showing the bottom surface side of the inkjet head 1, the pressure chambers 2 are arranged in plurality in two rows, and their bottom surface side is covered and closed by the nozzle plate 9. The multiple nozzles 3 formed in the nozzle plate 9 are disposed at positions connecting to the respective pressure chambers 2, and regularly arranged in two rows.

In FIG. 2, the pressure chambers 2 are shown in a simplified configuration in a matrix of 12×2 rows. However, in effect, many more pressure chambers 2 are formed in correspondence with the numerous actuators 4, as described above. Also, in the present embodiment, the pressure chambers 2 are shown in two rows, but they may not necessarily be in two rows. The number of nozzles necessary for each row, the chip size, the total number of required nozzles, and the like are to be considered in deciding an appropriate number of rows. In general, the yield of actuators and pressure chambers can be improved by reducing the number of rows, and reducing the chip size, but the steps of assembling chips in inkjet heads become more complex.

The pressure chambers 2 are connected to one another by the connecting passage section 7 formed along an arrangement direction of the pressure chambers 2. Further, the connecting passage section 7 is provided with a reservoir (not shown) connected thereto, and an ink introduction port (not shown) is formed in the reservoir. With the structure described above, ink is supplied from an ink tank (not shown) provided independently of the inkjet head 1, through a tube (not shown) to the ink introduction port, and through the reservoir and the connecting passage section 7, to the pressure chambers 2.

The upper structure 6 is joined to an upper surface side of the lower structure 5, in other words, to a surface of the lower structure 5 on the opposite side of the nozzle plate 9, as shown in FIG. 1. The upper structure 6 has the vibration plate 10 at its bottom surface side, and a lower surface of the vibration plate 10 is joined to the lower structure 5, whereby the upper structure 6 is joined to the lower structure 5 in one piece. The vibration plate 10 covers the upper surface side of the pressure chambers 2 to thereby close the pressure chambers 2, as described above. The vibration plate 10 is displaced (flexed) by driving of the actuator 4, thereby changing an internal pressure of each of the pressure chambers 2.

The vibration plate 10 is formed from a laminated film of silicon oxide ($SiO_x$ such as $SiO_2$) and zirconium oxide ($ZrO_x$ such as $ZrO_2$). More concretely, a silicon oxide film (not shown) is disposed on the side of the lower structure 5, and a zirconium oxide film (not shown) is disposed on the silicon oxide film, whereby the laminated film forms the vibration plate 10. The vibration plate 10 is formed to a thickness of, for example, about 1-2 μm. It is noted that the vibration plate 10 may be formed from a single layer of, for example, a film of zirconium oxide, instead of the laminated film of multiple layers.

The actuators 4 are formed on the vibration plate 9. The actuators 4 are arranged in one-to-one correspondence with the pressure chambers 2, as described above, and disposed immediately above the respective pressure chambers 2 arranged in two rows, as shown in FIG. 1, and therefore the actuators 4 are also arranged in two rows. The actuators 4 are formed from piezoelectric elements in the present example, and are each composed of a lower electrode 11, a piezoelectric film 12 and an upper electrode 13.

The lower electrode 11 is formed over the entire surface of the vibration plate 10 in the present embodiment, and is composed of platinum or the like having a thickness of, for example, about 0.2 μm. The lower electrode 11 is formed on the entire surface of the vibration plate 10, and therefore is displaced with the vibration plate 10 when driven by the actuators 4. In other words, the lower electrode 11 is a component of each of the actuators 4, and exhibits the same function as that of the vibration plate 10. It is noted that the lower electrode 11 in the present embodiment serves as a common electrode for the multiple actuators (piezoelectric elements) 4.

The piezoelectric films 12 are formed from PZT (Pb (Zr, Ti) $O_3$) or the like having a thickness of, for example, about 1 μm, and the upper electrodes 13 are formed from platinum or the like having a thickness of, for example, about 0.1 μm. The piezoelectric films 12 and the upper electrodes 13 are formed in islands independently of one another for the respective actuators 4, unlike the lower electrode 11. In such a structure, the actuators 4 are driven independently of one another.

A wiring 15 is connected to each of the actuators 4 through a protection film 14. In other words, the protection film 14 that covers the piezoelectric films 12 and the upper electrode 13 and is composed of aluminum oxide (AlOx such as $Al_2O_3$) or the like is formed over the lower electrode 11. Contact holes 16 that connect to the respective upper electrodes 13 are formed in the protection film 14, whereby the wiring 15 is electrically connected to the upper electrodes 13, respectively.

A sealing plate 17 is attached to the top side of the upper structure 6 that is formed from the vibration plate 10, the actuators 4 and the wirings 15, thereby forming the inkjet head 1 of the present embodiment. The sealing plate 17 has a function to protect the actuator sections, a function as a wiring substrate with a driver control IC chip provided thereon, and a function as a wafer support substrate when CMP is performed. Alternatively, without directly providing a control IC on the sealing plate 17, a flexible circuit board (not shown) may be externally provided and connected to the wiring 15 through the sealing plate 17, and a semiconductor device that controls driving of the actuators 4 may be provided on the flexible circuit board.

In the inkjet head 1 having the structure described above, upon energizing the actuator 4, the piezoelectric film 12 is flexed and displaced by the piezoelectric effect, whereby the piezoelectric film 12 is bent outwardly. Then, the lower electrode 11 and the vibration plate 10 are concurrently displaced together with the piezoelectric film 12, and therefore bend outwardly (to the side of the sealing plate 17), whereby the volume in the pressure chamber 2 is increased, which lowers its internal pressure. When the volume of the pressure chamber 2 increases and its internal pressure lowers, and if ink is filled in the reservoir (not shown) connected through the connection passage section 7, the ink flows in the pressure chamber 2 from the reservoir through the connection passage section 7 in an amount corresponding to the increase in the volume of the pressure chamber 2.

Then, when the actuator 4 in the state described above is energized by the reverse potential, the vibration plate 10 flexes toward the side of the pressure chamber 2, whereby the volume of the pressure chamber 2 decreases, and its internal pressure increases. By this, the ink is ejected in the form of a droplet through the nozzle 3. It is noted that the ink is supplied to the reservoir through the tube (not shown) from the ink tank (not shown) provided independently of the inkjet head 1, as described above.

Next, a method for manufacturing an inkjet head in accordance with an embodiment of the invention is described based on the inkjet head 1 having the structure described above. The manufacturing method of the invention is different from other manufacturing methods in related art in that a lower structure 5 and an upper structure 6 are formed independently of one another by a semiconductor process, and the two structures are joined together when they are judged as non-defective, thereby obtaining a non-defective inkjet head 1.

Figure 3A:
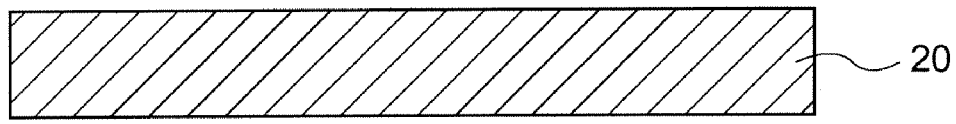
FIGS. 3A-3D are views showing steps of manufacturing the inkjet head shown in FIG. 1.

In accordance with the present embodiment, a silicon substrate (silicon wafer) 20 is prepared, as shown in FIG. 3A. In the method in related art, a silicon substrate is directly processed by anisotripic etching with KOH, to thereby form pressure chambers, such that an expensive Si (110) substrate needs to be used as the silicon substrate. However, according to the invention, a silicon substrate is not processed to form pressure chambers, such that an expensive Si (110) substrate does not need to be used, and a relatively inexpensive ordinary Si (100) substrate can be used.

Figure 3B:
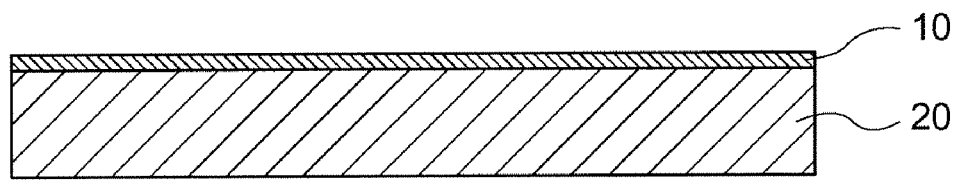

Then, a thermal oxidation treatment is applied to the silicon substrate 20, thereby forming a silicon oxide ($SiO_2$) film on its surface layer portion. Then, a film of zirconium (Zr) is formed on the silicon oxide film by a sputter method. Then, by applying a thermal oxidation treatment, a film of zirconium oxide ($ZrO_2$) is formed from the zirconium film, whereby a vibration plate 10 formed from a laminated film composed of the silicon oxide film and the zirconium oxide film is formed, as shown in FIG. 3B. It is noted that the zirconium oxide film serves to adjust the film thickness and rigidity of the vibration plate, and to control the orientation of a platinum electrode film (i.e., a lower electrode 11) to be formed thereon, and acts as a diffusion barrier layer that prevent lead of PZT contained in an upper layer (i.e., a piezoelectric film 12) from diffusing into the silicon oxide film. The function to adjust the film thickness and rigidity of the vibration plate may possibly be attained solely by the silicon oxide film, and the zirconium oxide film may not necessarily be required, if the orientation of the platinum film (i.e., the lower electrode 11) can be controlled by an electrode forming process, and lead diffusion can be prevented by the electrode.

Figure 3C:
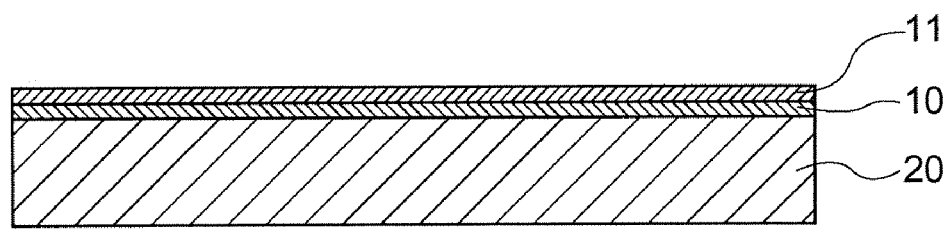

Then, a film of platinum is formed on the vibration plate 10 by a vapor phase method such as a sputter method, whereby a lower electrode 11 is formed, as shown in FIG. 3C. The platinum electrode film (the lower electrode 11) may be formed not only by the sputter method, but also by a vapor phase process such as a vapor deposition method, or a liquid phase process such as a plating method. Prior to forming the lower electrode 11, an adhesive layer is formed on the zirconium oxide film. In general, the adhesive layer may be composed of TiOx, but ZrOx may also be used.

Although platinum is used for the lower electrode 11 in the present embodiment, other metals such as Ir, and conductive oxides such as $SrRuO_3$, $LaNiO_3$ or the like may be used. The lower electrode 11 requires a function not only as an electrode, but also a function to control the orientation of a piezoelectric film 12 to be formed above. In particular, an oxide electrode having a perovskite structure oriented to (100) is most convenient to control the orientation of PZT (the piezoelectric film 12).

Figure 3D:
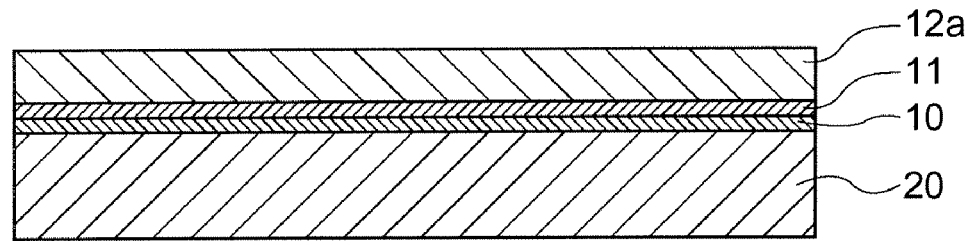

Then, a piezoelectric layer 11*a* composed of PZT is formed on the lower electrode 11 by a liquid phase method such as a sol-gel method, as shown in FIG. 3D. The method for forming the piezoelectric layer 12*a* by a sol-gel method may include dissolving (dispersing) compounds containing metal elements composing PZT, i.e., Pb, Zr and Ti, such as, for example, organic compounds such as alkoxides, in a solvent (dispersion medium), disposing the obtained solution (dispersion liquid) on the lower electrode 10 by a known coating method, and then sintering the coated solution, whereby the piezoelectric layer 12a is obtained. Besides the sol-gel method, the piezoelectric layer 12a may be formed by other methods, such as, for example, a vapor phase method such as a sputter method, a CVD method and a MOCVD method, or a liquid phase process such as a hydrothermal method.

Figure 4A:
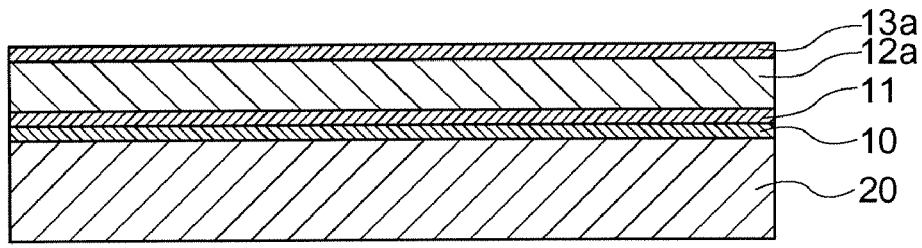
FIGS. 4A-4D are views showing steps of manufacturing the inkjet head shown in FIG. 1.

Then, a film of platinum is formed on the piezoelectric layer 12a by a vapor phase method such as a sputter method, whereby an upper electrode layer 13a is formed, as shown in FIG. 4A. It is noted that the upper electrode layer 13a may also be formed by a liquid phase method such as a plating method, like the lower electrode 11, and may not necessarily be composed of platinum.

Figure 4B:
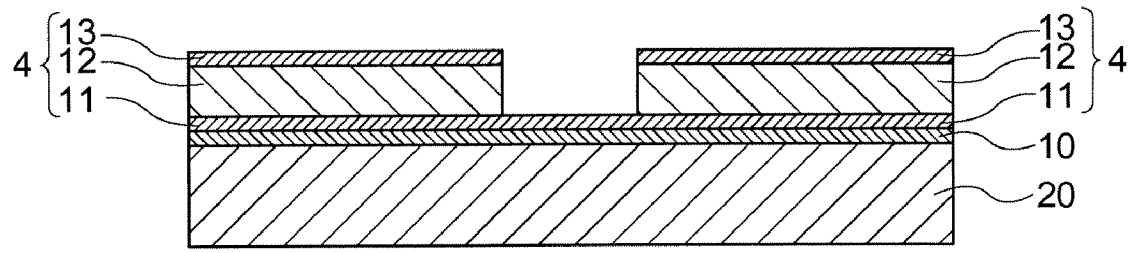

When the piezoelectric layer 12a and the upper electrode layer 13a are formed on the lower electrode 11, a resist pattern (not shown) is formed by known resist technique, and exposure and development technique. Then, by using the resist pattern as a mask, dry etching such as reactive ion etching (RIE) is conducted to pattern the upper electrode layer 13a and the piezoelectric layer 12a, whereby upper electrodes 13 and piezoelectric films 12 are formed, as shown in FIG. 4B. As a result, actuators 4 composed of piezoelectric devices can be obtained.

Figure 5:
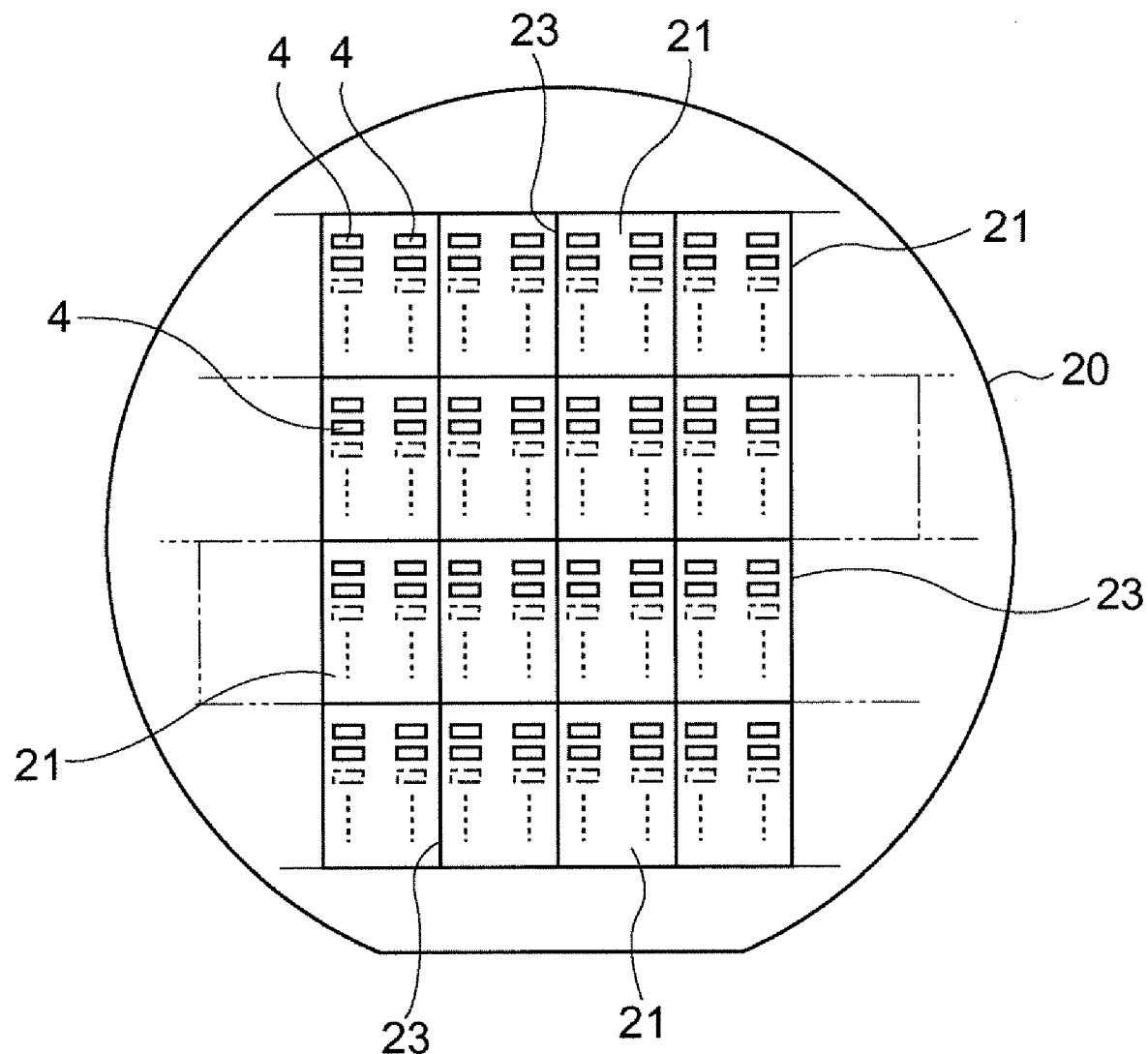
FIG. 5 is a plan view of a silicon substrate, for describing a manufacturing process.

When the actuators 4 are formed by patterning the upper electrode layer 13a and the piezoelectric layer 12a, a plurality of (for example, 40) chip regions 21 are defined on the silicon substrate 20, as shown in FIG. 5. A predetermined number of actuators 4 are formed in two rows in each of the chip regions 21. It is noted that, by the etching for forming the actuators 4, grooved boundary sections 22 that define, in particular, the chip regions 21 and divide adjacent ones of the chip regions 21 are formed. The boundary sections 22 may be formed by, for example, etching the layers to the silicon oxide layer in the vibration plate 10 to thereby expose the silicon substrate 20.

Figure 4C:
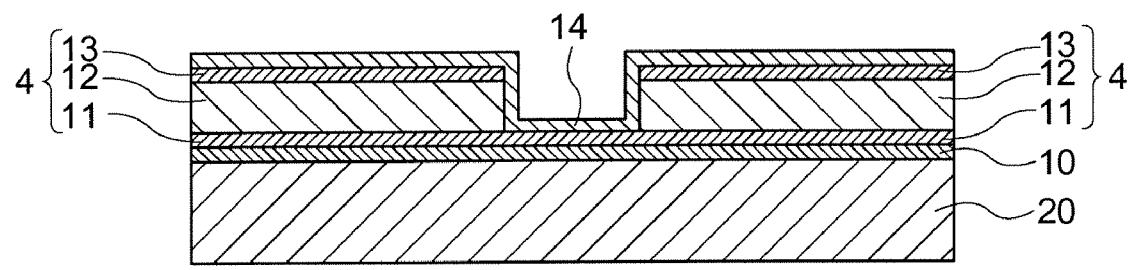

Then, as shown in FIG. 4C, a protection film 14 that covers the actuators 4 is formed over the silicon substrate 20 by a sputter method or the like. It is noted that the protection film 14 protects the PZT (the piezoelectric film 12) from external environments (humidity in particular), and may preferably be as thin as possible to the extent that the protection film 14 can perform its function, and the actuator 4 is not prevented from bending.

Figure 4D:
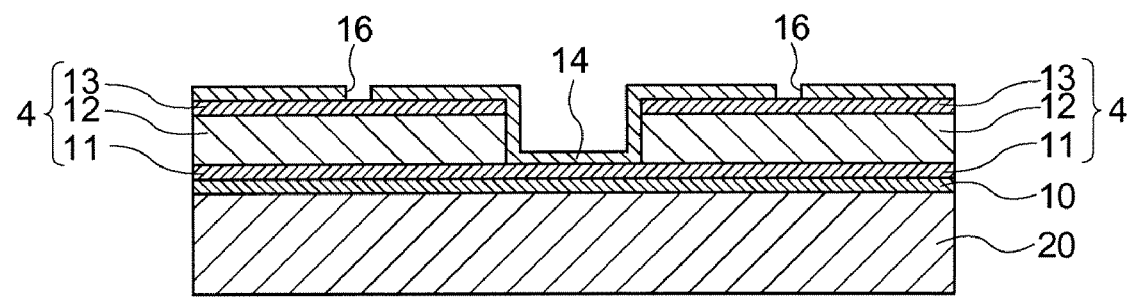

Then, a resist pattern (not shown) is formed on the protection film 14, and the protection film 14 is etched by using the resist pattern as a mask, whereby contact holes 16 that connect to the upper electrodes 13 are formed, as shown in FIG. 4D.

In the case of contact holes formed in an interlayer dielectric film of a semiconductor chip, in general, their aspect ratio is high, and tungsten plugs or the like need to be formed in the contact holes. However, in the present embodiment, the protection film 14, which corresponds to the aforementioned interlayer dielectric film, is very thin, which is about 100 nm in thickness, and the contact diameter would be greater than several μm, such that the aspect ratio of each of the contact holes 16 is extremely small. For this reason, plugs are not required to be formed, and a wiring layer can be directly formed after the contact holes 16 have been formed.

Figure 6A:
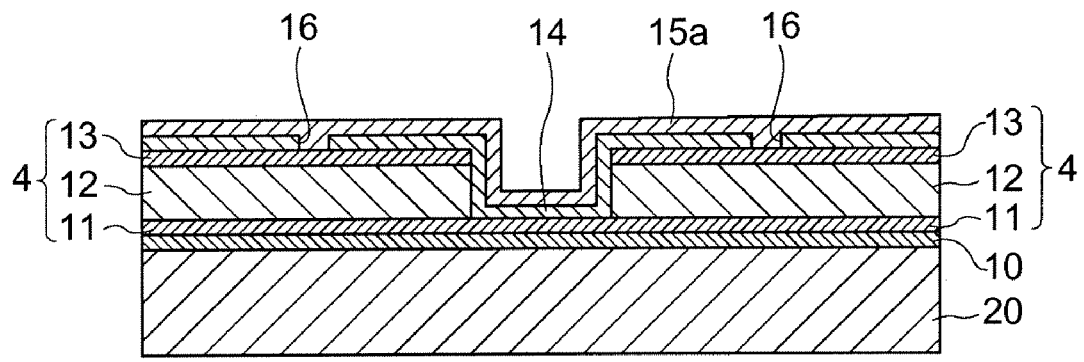
FIGS. 6A-6C are views showing steps of manufacturing the inkjet head shown in FIG. 1.
Figure 6B:
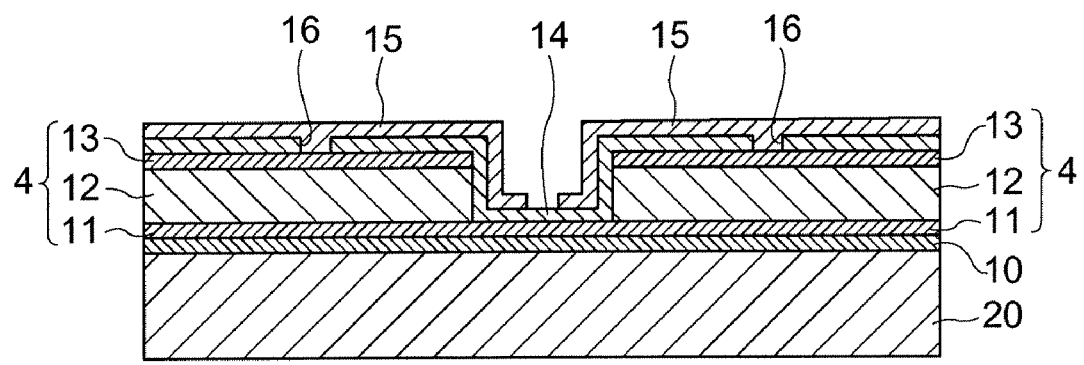

Then, a film of wiring material such as Al, Au or the like is formed on the protection film 14, as shown in FIG. 6A, thereby forming a wiring layer 15a. Then, the wiring layer 15a is patterned by known resist technique, exposure and development technique, and etching technique, whereby wirings 15 that electrically connect to the upper electrodes 13 are formed, as shown in FIG. 6B.

When the wirings 15 are connected to the actuators 4, respectively, all of the actuators 4 on the silicon substrate 20 are examined for their electrical property, and for their external appearance, whereby electrical characteristics and external appearance of each of the chip regions 21 shown in FIG. 5 are judged for their acceptance.

Figure 6C:
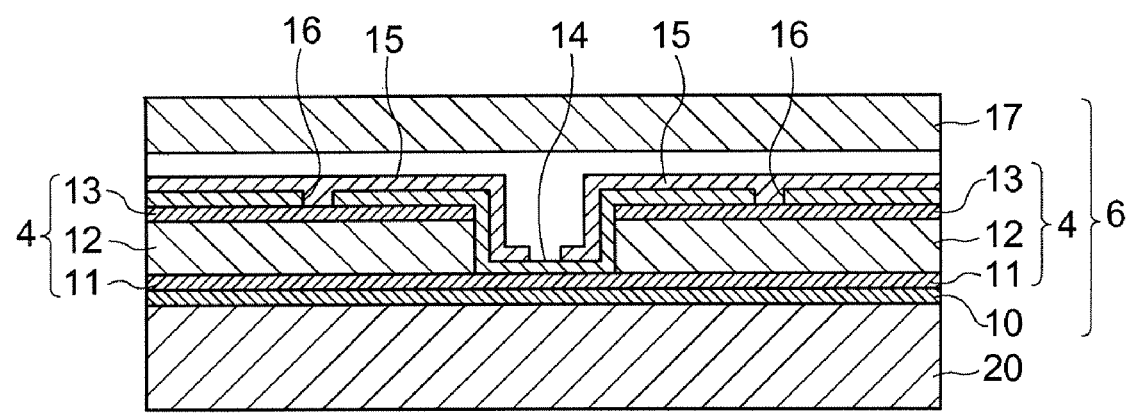

Then, an interlayer dielectric film or the like (not shown) that covers the wirings 15 may be formed depending on the requirements, and a sealing plate 17 is adhered to the entire surface over the silicon substrate 20 by adhesive or the like, as shown in FIG. 6C. As a result, upper structures 6 are formed for the respective chip regions 21 shown in FIG. 5 on the silicon substrate 20.

Figure 7A:
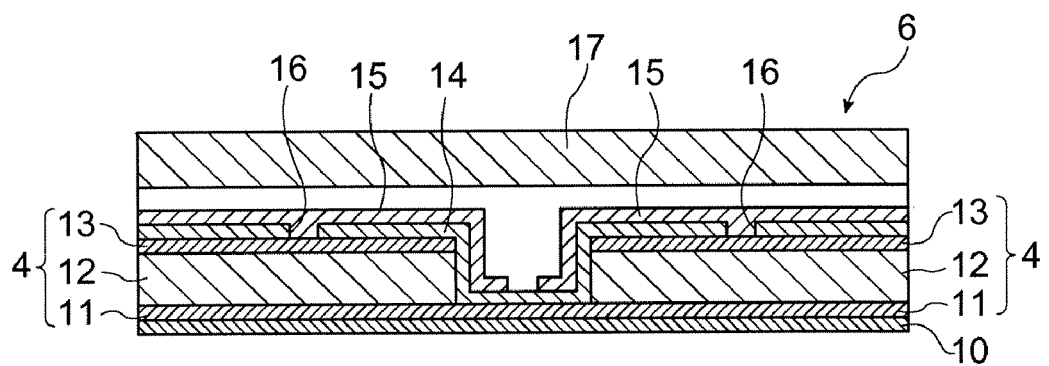
FIGS. 7A-7C are views showing steps of manufacturing the inkjet head shown in FIG. 1.

Then, a bottom surface side of the silicon substrate 20, in other words, a surface side of the silicon substrate 20 opposite to the side where the actuators 4 are formed, is polished by a chemical mechanical polishing method (CMP method), whereby a bottom surface side of the vibration plate 10 is exposed, as shown in FIG. 7A. By this, the silicon substrate 20 can be removed from the upper structure. It is noted that, by controlling the amount of polishing, to thereby appropriately adjust the amount of polishing of the silicon oxide film in the vibration plate 10 in particular, the thickness of the vibration plate 10 can be readily controlled to a desired thickness. Alternatively, the silicon oxide film may be entirely removed, thereby exposing the zirconium oxide, such that the vibration plate 10 may be formed from a single layer film composed solely of zirconium oxide.

Then, by conducting etching and dicing depending on the requirements, the chip regions 21 shown in FIG. 5 are separated, whereby upper structures 6 for the respective chips are obtained, as shown in FIG. 7A. When the upper structures 6 are obtained in the respective chips, those of the upper structures 6 which have been judged non-defective based on the results of examination conducted for electrical property and external appearance are selected, and used for the next step.

Figure 7B:
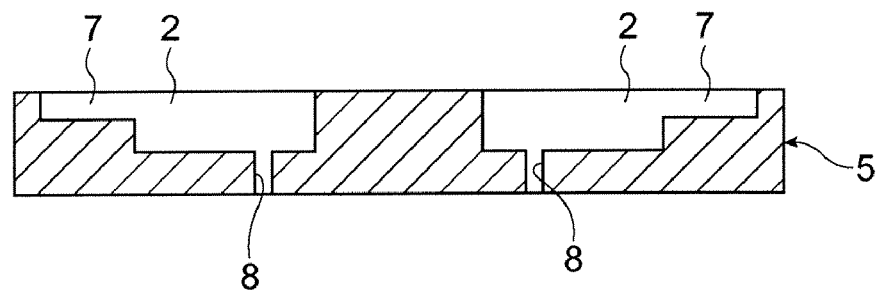

On the other hand, independently of the process using the silicon substrate 20, a lower structure 5 having pressure chambers 2 is formed, as shown in FIG. 7B, from metallic glass. It is noted that the lower structure 5 is formed to have a structure corresponding to each of the chips, in other words, a structure in which the pressure chambers 2 are arranged, for example, in a matrix of 180×2 rows, or 360×2 rows. The lower structures 5 may preferably be formed by using, in particular, one of the following two mold forming methods.

Figure 8A:
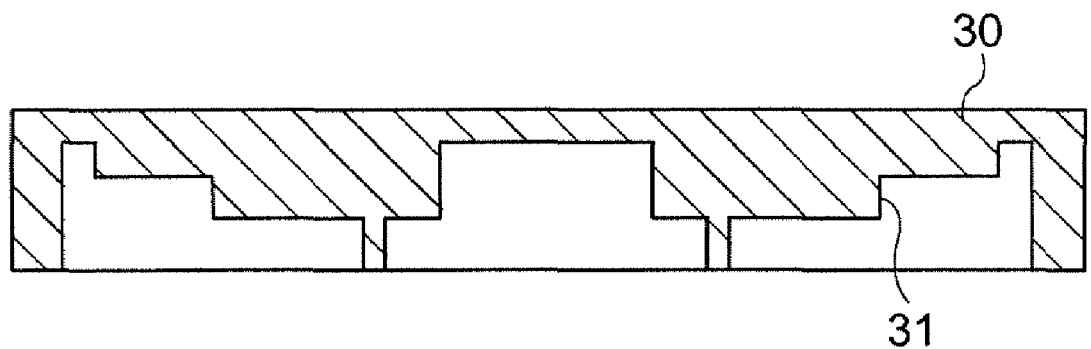
FIGS. 8A and 8B are views showing steps of manufacturing a lower structure.

The first mold forming method is a method that uses a mold composed of silicon (i.e., a silicon mold). According to this method, a silicon substrate is processed by the silicon processing technology, MEMS or the like which are used in semiconductor processing, whereby a silicon mold 30 for forming a lower structure is formed, as shown in FIG. 8A. By processing one side of the silicon substrate, cavities 31 corresponding to the configuration of the lower structures are formed, whereby the silicon mold 30 is obtained. It is noted that, because silicon can be readily processed, and highly accurately processed, the silicon mold 30 can be readily and highly accurately fabricated.

Figure 8B:
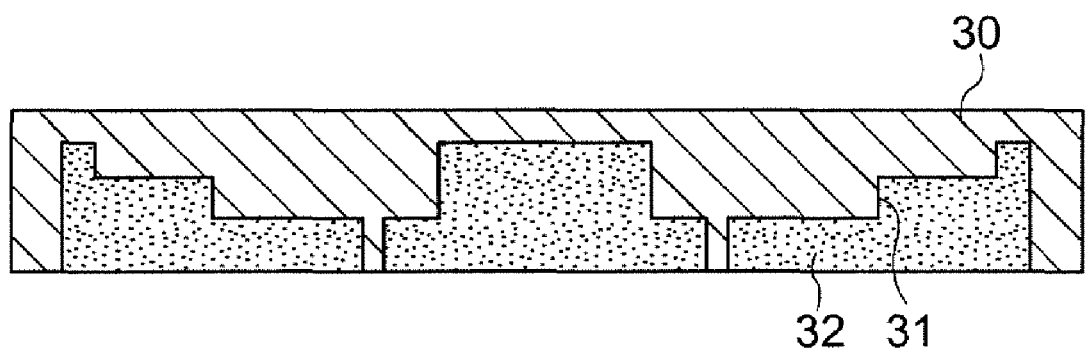

Next, as shown in FIG. 8B, a liquid material 32 that is a precursor of metallic glass hardening body is injected in the silicon mold.

As a method for preparing (forming) the liquid material 32 of metallic glass, for example, the following two methods may be conducted.

In the first method, a hydrolysable organometallic compound is hydrolyzed and dehydrated in a reaction liquid composed of water and organic solvent while its pH is being adjusted at 4.5-5.0, using halogen ions as catalyst in the presence of boron ions. By this, the liquid material 32 that is a precursor of metallic glass hardening body can be obtained.

In the second method, a hydrolysable organometallic compound is hydrolyzed and dehydrated in a reaction liquid composed of water and organic solvent while its pH is being adjusted at 8-10, using halogen ions as catalyst in the presence of boron ions. Then, settled reaction product is separated by washing with water. By this, the liquid material 32 that is a precursor of metallic glass hardening body can be obtained.

The liquid material 32 thus prepared is vitrified by heating, for example, at a temperature below 200° C., whereby the liquid material 32 become hardened metallic glass, i.e., a hardened body of metallic glass. It is noted that, as the hardened body of metallic glass obtained in this manner may preferably include at least one of Pd, Cu, Si, Al, Zr, a rare earth, Ti, Fe, Mg, Ni, Co and Ca as a principal constituent or an additive constituent.

The organometallic compound that is a raw material used for preparation of the liquid material 32 may not be particularly limited, as long as it is hydrolysable. A favorable organometallic compound is a metal alkoxide, which is expressed by a general formula, $MR^2_m (OR^1)_{n-m}$. In the formula, "M" indicates a metal with an oxidation number being n, "$R^1$" and "$R^2$" indicate alkyl groups, and "m" indicates an integer of 0 to (n−1). The $R^1$ and $R^2$ may be the same group or different groups with respect to each other. Above all, as the $R^1$ and $R^2$, alkyl groups with four or less carbon atoms, namely, low alkyl groups, such as, for example, methyl group [$CH_3$—] (hereafter expressed as Me), ethyl group [$C_2H_5$—] (hereafter expressed as Et), propyl group [$C_3H_7$—] (hereafter expressed as Pr), isopropyl group [i-$C_3H_7$—] (hereafter expressed as i-Pr), butyl group [$C_4H_9$—] (hereafter expressed as Bu), and isobutyl group [i-$C_4H_9$—] (hereafter expressed as i-Bu) are favorably used.

As the metal alkoxide, for example, lithium ethoxide [LiOEt], niobate ethoxide [Nb(OEt)$_5$], magnesium isopropoxide [Mg(OPr-i)$_2$], aluminum isopropoxide [Al(OPr-i)$_3$], lead propoxide [Zn(OPr)$_2$], tetraethoxysilane [Si(OEt)$_4$], titanium isopropoxide [Ti(OPr-i)$_4$], barium ethoxide [Ba(OEt)$_3$], barium isopropoxide [Ba(OPr-i)$_2$], triethoxy borane [B(OEt)$_3$], zirconium propoxide [Zr(OPr)$_4$], lanthanum propoxide [La(OPr)$_3$], yttrium propoxide [Y(OPr)$_3$], and lead isopropoxide [Pb(OPr-i)$_2$] can be enumerated. Commercial produces of these metal alkoxides are available, and they are readily available. Also, low condensation products that form the metal alkoxides upon partial hydrolysis are also commercially available. Therefore, these products can be used as the raw materials.

Also, the hydrolysable organometallic compound described above may be used as it is for the reaction, but may preferably be diluted with a solvent to facilitate the control of reaction. As the solvent for dilution, any one of those that can dissolve the organometallic compound, and can be uniformly mixed with water can be used. Generally, aliphatic lower alcohol, such as, for example, methanol, ethanol, propanol, isopropanol, butanol, isobuthanol, ethyleneglycol, propyleneglycol, and a mixture of the aforementioned can be favorably used. Also, a mixed solvent, such as, a mixture of buthanol+celsolve+butyl celsolve, and a mixture of xylole+celsolve acetate+methyl isobutyl ketone+cyclohexane can be used.

When metals in the organometallic compound are Ca, Mg and Al, these metals may react with water in the reaction liquid and generate hydroxides, or generate carbonates if carbon ions $CO_3^{2-}$ are present, whereby precipitation may occur. Therefore, an alcohol solution of triethanolamine may desirably be added as a masking agent. The organometallic compound may be mixed and diluted with a solvent, and the concentration of the organometallic compound as diluted may normally be 70 (weight) % or less, more preferably be in a range between 5 (weight) % and 70 (weight) %.

Also, the reaction liquid to be used is generally formed from water and organic solvent. As the organic solvent to be used in the reaction liquid, any of those that form a uniform solution when mixed with water, acid or alkali may be used. Normally, aliphatic lower alcohol groups that are used for diluting the organometallic compound described above may favorably be used. Among the lower alcohol groups, those with a greater carbon number compared to methanol or ethanol, such as, propanol, isopropanol, buthanol and isobuthanol are preferred. The mixing ratio of water and organic solvent composing the reaction liquid may be in a range between 0.2 mol/l and 50 mol/l in the concentration of water.

Furthermore, the organometallic compound is hydrolyzed in the reaction liquid, using halogen ions as catalyst in the presence of boron ions. As the compound that gives boron ions $B^{3+}$, trialkoxy borane [B(OR)$_3$] may be used. Above all, triethoxy borane [B(OEt)$_3$] is favorably used. The $B^{3+}$ ion concentration in the reaction liquid may preferably be in a range between 1.0 mol/l and 10.0 mol/l. As the halogen ions, $F^-$ and $Cl^-$, or their mixture may be used. As the compound to be used, any of those that generate $F^-$ ions and $Cl^-$ ions in the reaction liquid may be used. For example, ammonium hydrogen fluoride [NH$_4$F.HF], sodium fluoride [NaF] or the like may preferably be used as the source of $F^-$ ions, and ammonium chloride [NH$_4$Cl] or the like may preferably be used as the source of $Cl^-$ ions.

The concentration of the halogen ions in the reaction liquid is not particularly limited, but may preferably be in the range of 0.001-2 mol/kg with respect to the total weight of the reaction liquid including catalyst, and more preferably be in the range of 0.002-0.3 mol/kg. When the concentration of the halogen ions is lower than 0.001 mol/kg, hydrolysis of the organometallic compound becomes difficult to sufficiently advance. When the concentration of the halogen ions exceeds over 2 mol/kg, the generated metallic glass would readily become heterogeneous.

The hydrolysis reaction of the organometallic compound can be conducted as follows. Normally, a predetermined amount of organometallic compound is mixed and dissolved in a predetermined amount of mixed solution of water and organic solvent to form a main agent solution, and the main agent solution and a predetermined amount of reaction liquid containing a predetermined amount of halogen ions are mixed in a predetermined ratio and sufficiently stirred to form a homogeneous reaction solution. Then, pH of the reaction solution is adjusted by acid or alkali to a desired value, and the adjusted reaction solution is aged for several hours. A predetermined amount of boron compound is mixed and dissolved in advance in the main agent solution or the reaction liquid. When alkoxy borane is used, it is advantageous if the alkoxy borane is mixed in the main agent solution together with the other organometallic compounds. By the hydrolysis and dehydration-condensation described above, the metallic glass liquid material 32 is formed.

The metallic glass liquid material 32 thus obtained is maintained in a liquid state at room temperature. When heated at a relatively low temperature, for example, 200° C. or lower, the metallic glass liquid material 32 hardens, and becomes a vitreous material when hardened. The vitreous material thus obtained excels in light-resistance, moisture-resistance, and heat-resistance, compared to resin materials, and has sufficient durability.

Accordingly, the metallic glass liquid material 32 thus formed is poured in the silicon mold 30, as described above, and the liquid material 32 is heated at 200° C. or lower in this state, more specifically, the liquid material 32 is heated at about 100° C. for about 30 minutes to about 2 hours by infrared radiation, whereby the metallic glass is hardened. Then, the metallic glass hardened body is separated from the silicon mold 30, whereby a lower structure 5 composed of the metallic glass hardened body can be obtained, as shown in FIG. 7B.

Alternately, instead of the metallic glass liquid material 32, metallic glass hardened body may be placed in the silicon mold 30, and a lower structure 5 composed of the metallic glass hardened body can be obtained by a pressure forming method. In other words, because the lower structure 5 is a very thin structure, the lower structure 5 can be readily formed by a pressure forming method. According to this forming method, first, a plate of metallic glass hardened body is formed from the liquid material 32. Then, the plate of hardened body is pressed against the silicon mold, thereby forcefully pushing the hardened body in the cavities 31 of the silicon mold 30. In this instance, the hardened body may be heated according to the requirements, thereby softening the hardened body. When the hardened body is pushed in the cavities 31, the shape of the cavities 31 is transferred to the hardened body. Then, the hardened body is separated from the silicon mold 30, whereby the lower structure 5 shown in FIG. 7B can be obtained.

According to the forming method used for forming the lower structure 5, the silicon mold 30 can be relatively easily and highly accurately formed by using a silicon substrate, such that the lower structure 5 can be readily and highly accurately formed from the silicon mold 30.

Figure 9A:
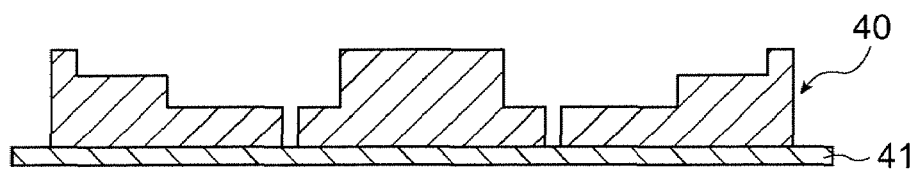
FIGS. 9A-9E are views showing steps of manufacturing the lower structure.

Also, the second mold forming method is a method in which a replica of a lower structure is formed by processing silicon, and a metal mold that is fabricated based on the replica is used. According to this method, first, silicon is processed by a silicon processing technology and MEMS which are used in a semiconductor process, thereby forming a replica 40 of a lower structure 5, as shown in FIG. 9A. It is noted that, in the replica 40 illustrated in FIG. 9A, a plate section 41 is formed on the bottom surface side of the replica 40 in a manner that the plate section 41 extends outwardly from a portion corresponding to the lower structure 5.

Figure 9B:
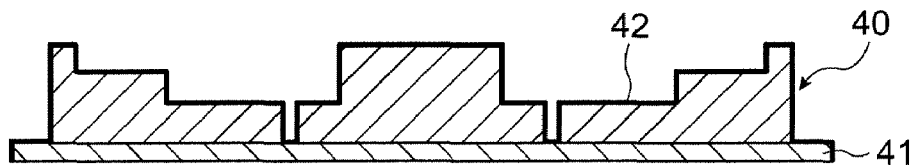

Then, as shown in FIG. 9B, a conductive film 42 is formed on the surface of the replica 40. The conductive film 42 may preferably be formed from, for example, a metal such as Ni. For example, Ni may be formed in a film on the surface of the replica 40 by a sputter method or an electroless plating method, thereby forming the conductive film 42.

Figure 9C:
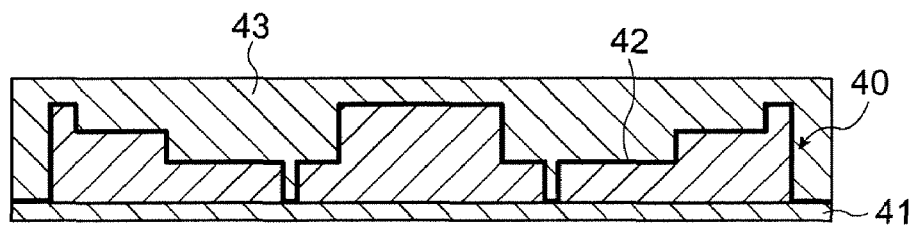

Then, a metal mold that covers the surface of the replica 40 is formed by an electroforming method. More specifically, the replica 40 and the conductive film 42 formed on the surface thereof are used as an electroforming mold, and electroless plating is conducted, using the conductive film 42 of the electroforming mold as a cathode, whereby a metal such as Ni or its alloy is electroplated on the outer surface of the electroforming mold. By this, a metal mold 43 is formed, as shown in FIG. 9C.

Figure 9D:
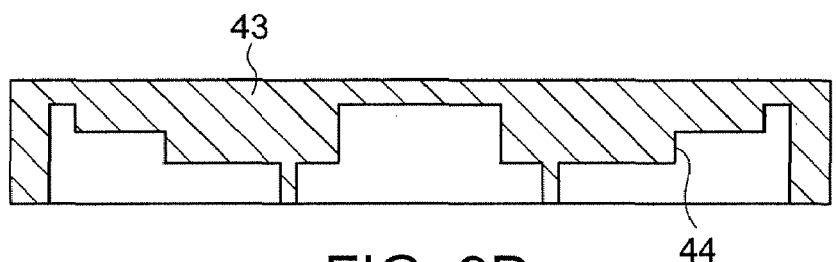

Then, the replica 40 is separated from the metal mold 43, whereby the metal mold 43 having cavities 44 in the configuration corresponding to the replica 40 is obtained, as shown in FIG. 9D. In this instance, the conductive film 42 formed on the surface of the replica 40 functions as a separation film, such that separation of the replica 40 from the metal mold 43 is facilitated. It is noted that, when separating the mold, the plate section 41 formed at the replica 40 can be peeled off from the metal mold 43, whereby the mold can be readily separated.

Figure 9E:
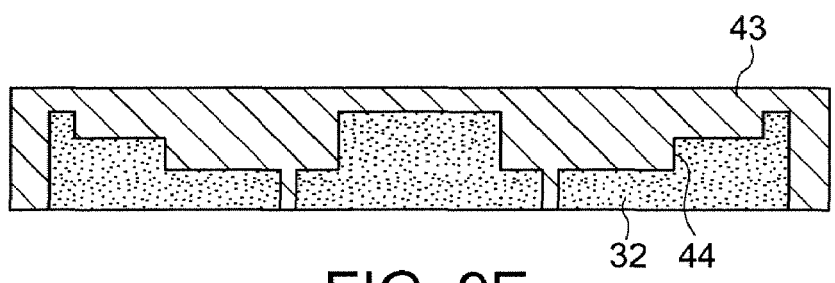

When the metal mold 43 is formed, the liquid material 32 that is a precursor of metallic glass hardened body is placed in the metal mold 43, as shown in FIG. 9E, like the first mold forming method described above, and is hardened. Then, the metallic glass hardened body is separated from the metal mold 43, whereby a lower structure 5 composed of the metallic glass hardened body shown in FIG. 7B can be obtained. Also, as described above, the lower structure 5 composed of metallic glass hardened body can be obtained by pushing a metallic glass hardened body in the metal mold 43.

According to the forming method used for forming the lower structure 5, because the replica 40 is fabricated from silicon, the replica 40 can be highly accurately formed. Accordingly, the metal mold 43 formed from the replica 40 becomes highly accurate, and therefore the lower structure 5 can be highly accurately formed with the metal mold 43. Also, the metal mold 43 is highly durable, compared for example to the silicon mold 30 described above, and therefore excels in mass-productiveness.

Depending on inks that are used in the completed inkjet head 1, a chemical reaction may occur between ink in the pressure chambers 2 and the lower structure 5, which may cause a galvanic effect and/or erosion. In this case, the lower structure 5 may be heated and oxidized in an air atmosphere, thereby forming an oxide film on its surface layer section. Through forming such an oxide film, a surface composing the inner surface of the pressure chamber 2 also becomes an oxide film, which is more chemically stable, and thus improves its chemical resistance property. Accordingly, the pressure chambers 2 are prevented from reacting with ink, and therefore have favorable resistance to a variety of inks.

Also, in the process of forming the lower structure 5 described above, the lower structure 5 may be formed from a plurality of members, instead of forming from a single member, and the plurality of members may be assembled to form the lower structure 5 shown in FIG. 7B. More concretely, in the first mold forming method or the second mold forming method, the silicon mold 30 or the metal mold 43 is divided into a plurality of mold segments, individual composing members of the lower structure 5 are formed with the mold segments by metallic glass, and the obtained composing members are assembled, thereby obtaining the lower structure 5.

Accordingly, even when the lower structure 5 has a complex configuration, the lower structure 5 is formed from a plurality of composing members, and the composing members are assembled to obtain the lower structure 5. Therefore, each of the composing members can be formed in a relatively simple configuration, and fabrication of the lower structure 5 of a complex configuration can be made relatively easy.

When the lower structures 5 are formed by the first mold forming method or the second mold forming method, the lower structures 5 obtained are examined for their external appearance and the like, to judge whether they are acceptable as products. Then, those of the lower structures 5 that have been judged non-defective based on the results of examination are selected, and used for the next step.

Figure 7C:
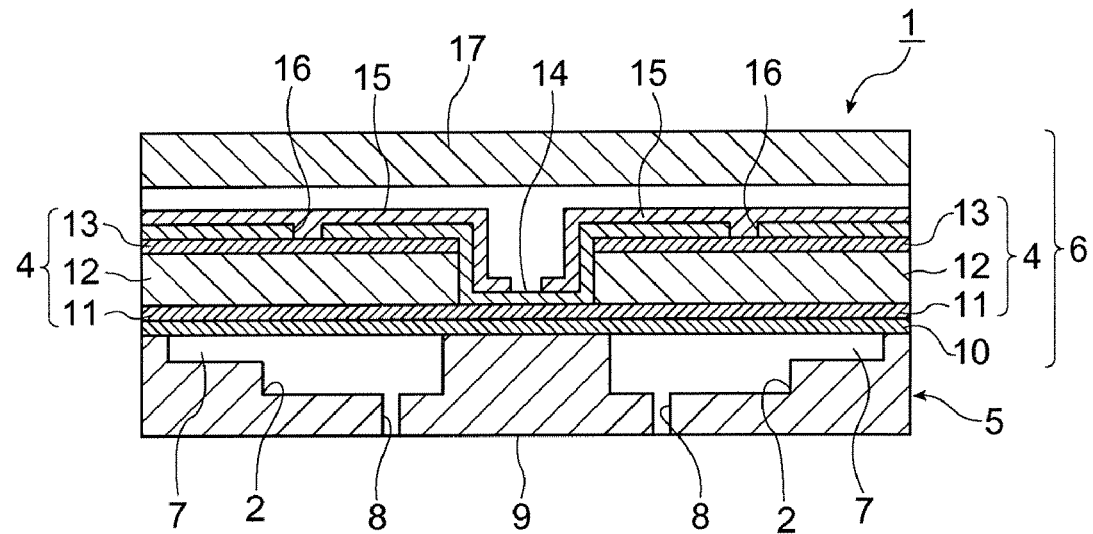

Then, the upper structure 6 that has been judged non-defective and the lower structure 5 that has been judged non-defective are assembled together, and the upper structure 6 on the side of the vibration plate 10 and the lower structure 5 on the side of its upper surface are joined together, as shown in FIG. 7C. As the joining method, diffusion joint in which electrons are diffused by application of pressure and heat, hydrogen joint, direct joint in which joint surfaces are activated by plasma treatment and directly joined together, and adhesion by adhesive can be used. For more readily and strongly joining the upper structure 6 and the lower structure 5, for example, the vibration plate 10 may be formed from a single layer film solely composed of zirconium oxide, and the metallic glass composing the lower structure 5 may contain zirconium (Zr) or its oxide, whereby they can be readily and strongly joined together by thermal diffusion between them.

Then, a nozzle plate 7 is attached by adhesive or the like to the bottom surface side of the lower structure 5 in an ordinary manner, whereby a head chip (not shown) is obtained. It is noted that the nozzle plate 7 may be attached, prior to joining the upper structure 6 and the lower structure 5. Then, a single head chip or a plurality of head chips thus manufactured are used and assembled in an ordinary manner, whereby an inkjet head 1 shown in FIG. 1 is obtained. The inkjet head 1 thus obtained is used for an ink jet printer, an industrial ink jet apparatus and the like.

According to the method for manufacturing the inkjet head 1, the upper structure 6 that includes the actuators 4 and the lower structure 5 that includes the pressure chambers 2 are formed independently of one another, and these structures are joined to form a head chip that becomes a component of the inkjet head 1. Accordingly, those of the upper structures 6 that have been examined in advance and judged non-defective, and those of the lower structures 5 that have been separately examined and judged non-defective are joined together, whereby the non-defective rate (yield) of the head chips can be improved, and their absolute quantity can be sufficiently secured.

According to the method in related art in which actuators and wirings to be connected to the actuators are directly formed on a silicon substrate, and pressure chambers are also formed in the same silicon substrate, the pressure chambers are formed after the actuators and wirings have been formed through many processing steps. Therefore, if defects occur in the pressure chambers due to, for example, foreign matters and deficiencies, the actuators and wirings that are normal, but formed on these defective pressure chambers, would consequentially become parts of defective products. Accordingly, these normal actuators and wirings cannot be included in final products, such that the yield is substantially lowered, and a reduction in the cost is prevented in the method in related art.

In contrast, in accordance with the present embodiment of the invention, as described above, normal upper structures 6 that are judged non-defective are joined with lower structures 5 that are similarly judged non-defective, whereby the problem associated with the related art in which normal components are rejected as defective can be eliminated, and therefore the non-defective rate (yield) of head chips can be improved, their absolute quantity can be sufficiently secured, and thus the manufacturing cost can be lowered.

Also, in the invention, the lower structure 5 is formed from metallic glass, such that process-induced differences are fewer, and the non-defective rate becomes higher, compared to the related art in which the lower structure is formed from a silicon wafer. Also, metallic glass is inexpensive compared to silicon that is generally expensive, such that the material cost can be lowered.

Also, the manufacturing process for forming the upper structure 6 of the inkjet head 1 which includes a high-temperature process, and the manufacturing process for forming the lower structure 5 which includes a low-temperature process are not continuously conducted, but conducted independently of one another. Therefore the process management becomes easier, and thus the productivity can be improved.

Also, because the inkjet heads 1 in accordance with the invention are obtained by joining the upper structures 6 that are examined in advance and judged non-defective with the lower structures 5 that are separately examined and judged non-defective, the non-defective rate (yield) is high, and their absolute quantity can be sufficiently secured.

Also, in the invention, the lower structure 5 is formed from metallic glass, such that process-induced differences are fewer, and the non-defective rate becomes higher, compared to the related art in which the lower structure is formed from a silicon wafer. Also, metallic glass is inexpensive compared to silicon that is generally expensive, such that the material cost can be lowered.

It is noted that the invention is not limited to the embodiment described above, and many changes can be made without departing from the subject matter of the invention. For example, in the embodiment described above, piezoelectric devices (piezoelectric elements) are used as actuators, but driver elements other than such electromechanical converter elements can be used as the actuators. Concretely, it is possible to use a driver element that uses an electro-thermal converter element as an energy generation element, a continuous type driver element of an electrification control type or a voltage application vibration type, an electrostatic suction type driver element, and a driver element of the type in which heat is generated by irradiation of electromagnetic waves such as laser and liquid is ejected by an action of the generated heat. Also, the forming method used for forming the lower structures 5 is not limited to the mold forming method, as long as the lower structures 5 can be formed from metallic glass, and any one of various known methods is applicable for forming the lower structures.

What is claimed is:

1. A method for manufacturing an inkjet head having a pressure chamber that stores ink, a nozzle that is provided at the pressure chamber and ejects the ink, and an actuator that changes an internal pressure of the pressure chamber to eject the ink in the pressure chamber through the nozzle, the method comprising the steps of:
   forming the actuator on a substrate by using one of a liquid phase method and a vapor phase method to manufacture an upper structure;
   separating the upper structure from the substrate;
   forming a lower structure having the pressure chamber with metallic glass, independently of the substrate; and
   joining the upper structure and the lower structure,
   wherein the step of forming the lower structure includes the steps of:
      forming a silicon mold for forming the lower structure by processing silicon;
      placing metallic glass in the silicon mold; and
      separating the metallic glass from the silicon mold to thereby form the lower structure.

2. A method for manufacturing an inkjet head according to claim 1, wherein the step of forming the lower structure includes forming an oxide film on a surface layer section of the lower structure composed of the metallic glass by thermally oxidizing the surface layer section.

3. A method for manufacturing an inkjet head according to claim 1, wherein the step of forming the lower structure includes forming a plurality of members with metallic glass that compose the lower structure, and then assembling the members to form the lower structure.

4. A method for manufacturing an inkjet head according to claim 1, wherein the actuator is formed from a piezoelectric device.

5. A method for manufacturing an inkjet head according to claim 1, wherein the substrate is a silicon substrate.

6. A method for manufacturing an inkjet head according to claim 1, wherein the metallic glass includes at least one of Pd, Cu, Si, Al, Zr, a rare earth, Ti, Fe, Mg, Ni, Co and Ca as a principal constituent or an additive constituent.

7. A method for manufacturing an inkjet head having a pressure chamber that stores ink, a nozzle that is provided at the pressure chamber and ejects the ink, and an actuator that changes an internal pressure of the pressure chamber to eject the ink in the pressure chamber through the nozzle, the method comprising the steps of:
   forming the actuator on a substrate by using one of a liquid phase method and a vapor phase method to manufacture an upper structure;
   separating the upper structure from the substrate;
   forming a lower structure having the pressure chamber with metallic glass, independently of the substrate; and
   joining the upper structure and the lower structure,
   wherein the step of forming the lower structure includes the steps of:
      forming a replica of the lower structure by processing silicon;
      forming a conductive film on a surface of the replica;
      forming a metal mold that covers the surface of the replica by an electroforming method;
      separating the replica from the metal mold;
      placing metallic glass in the metal mold; and
      separating the metallic glass from the metal mold to thereby form the lower structure.

8. A method for manufacturing an inkjet head according to claim 7, wherein the step of forming the lower structure includes forming an oxide film on a surface layer section of the lower structure composed of the metallic glass by thermally oxidizing the surface layer section.

9. A method for manufacturing an inkjet head according to claim 7, wherein the step of forming the lower structure includes forming a plurality of members with metallic glass that compose the lower structure, and then assembling the members to form the lower structure.

10. A method for manufacturing an inkjet head according to claim 7, wherein the actuator is formed from a piezoelectric device.

11. A method for manufacturing an inkjet head according to claim 7, wherein the substrate is a silicon substrate.

12. A method for manufacturing an inkjet head according to claim 7, wherein the metallic glass includes at least one of Pd, Cu, Si, Al, Zr, a rare earth, Ti, Fe, Mg, Ni, Co and Ca as a principal constituent or an additive constituent.

* * * * *